(12) United States Patent
Kornagel

(10) Patent No.: US 9,877,118 B2
(45) Date of Patent: Jan. 23, 2018

(54) METHOD FOR FREQUENCY-DEPENDENT NOISE SUPPRESSION OF AN INPUT SIGNAL

(71) Applicant: SIVANTOS PTE. LTD., Singapore (SG)

(72) Inventor: Ulrich Kornagel, Erlangen (DE)

(73) Assignee: Sivantos Pte. Ltd., Singapore (SG)

( * ) Notice: Subject to any disclaimer, the term of this patent is extended or adjusted under 35 U.S.C. 154(b) by 0 days.

(21) Appl. No.: 15/139,528

(22) Filed: Apr. 27, 2016

(65) Prior Publication Data

US 2016/0316303 A1 Oct. 27, 2016

(30) Foreign Application Priority Data

Apr. 27, 2015 (DE) .................. 10 2015 207 706

(51) Int. Cl.
*H04R 25/00* (2006.01)
*G10L 21/0232* (2013.01)
*H03G 9/02* (2006.01)
*H04R 1/10* (2006.01)

(52) U.S. Cl.
CPC ........ *H04R 25/505* (2013.01); *G10L 21/0232* (2013.01); *H04R 25/30* (2013.01); *H04R 25/453* (2013.01); *H03G 9/025* (2013.01); *H04R 1/1083* (2013.01); *H04R 2225/43* (2013.01); *H04R 2430/03* (2013.01); *H04R 2460/01* (2013.01)

(58) Field of Classification Search
CPC ........ H04R 3/02; H04R 25/30; H04R 25/356; H04R 25/453; H04R 25/505; H04R 2225/43; H04R 2430/03; H04R 2460/01; G10L 21/0232
USPC ...... 381/312, 314, 317, 318, 320, 321, 71.1, 381/71.11, 71.12, 93, 94.1, 94.2, 94.3, 381/106
See application file for complete search history.

(56) References Cited

U.S. PATENT DOCUMENTS

| 4,658,426 A * | 4/1987 | Chabries ............. G10L 21/0208 381/71.11 |
| 4,887,299 A * | 12/1989 | Cummins ............ H04R 25/356 381/106 |
| 5,027,410 A | 6/1991 | Williamson et al. |

(Continued)

FOREIGN PATENT DOCUMENTS

WO 9005437 A1 5/1990

*Primary Examiner* — Huyen D Le
(74) *Attorney, Agent, or Firm* — Laurence A. Greenberg; Werner H. Stemer; Ralph E. Locher

(57) ABSTRACT

A method for frequency-dependent noise suppression in an input signal is particularly suited for a hearing device. The input signal is distributed to a main signal path and an ancillary signal path. The presence of a useful signal component and, if a useful signal component is present, a parameter for a frequency of the useful signal component are assessed in the ancillary signal path. Noise in the input signal is suppressed in the main signal path by at least one infinite impulse response filter whose frequency response is implemented with a maximum absolute value in the range of that frequency of the useful signal component that is assessed using the parameter by determining a complex pole of the transfer function. The complex pole of the transfer function is determined by using the assessed parameter for the frequency of the useful signal component.

12 Claims, 2 Drawing Sheets

(56) References Cited

U.S. PATENT DOCUMENTS

| | | | |
|---|---|---|---|
| 5,091,952 A * | 2/1992 | Williamson | H04R 25/453 |
| | | | 381/318 |
| 6,523,003 B1 | 2/2003 | Chandran et al. | |
| 2006/0256764 A1 | 11/2006 | Yang et al. | |

* cited by examiner

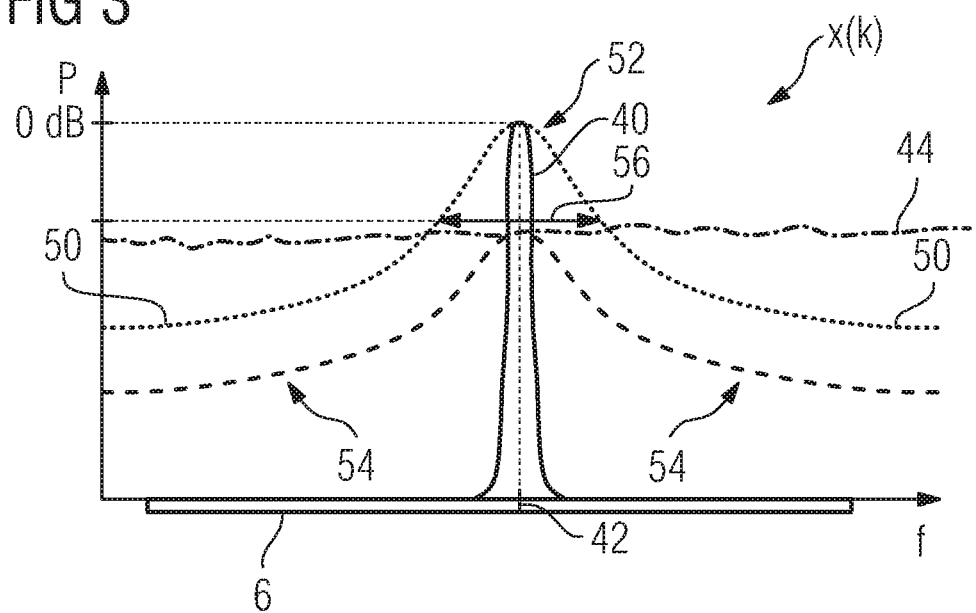
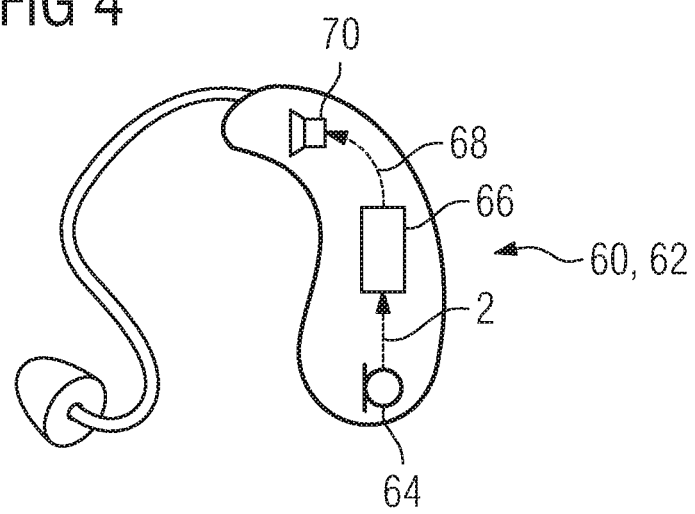

METHOD FOR FREQUENCY-DEPENDENT NOISE SUPPRESSION OF AN INPUT SIGNAL

BACKGROUND OF THE INVENTION

Field of the Invention

The invention relates to a method for frequency-dependent noise suppression in an input signal, wherein the input signal is distributed to a main signal path and an ancillary signal path, and wherein noise in the input signal is suppressed in the main signal path using a filter.

In a hearing device, it is possible, depending on the present hearing situation in which a user finds himself, for improvement of the hearing quality for the user to give rise to the requirement to perform noise suppression on an input signal recorded by a microphone of the hearing device. Often, actually desired perception of a useful signal is rendered difficult by the presence of wideband noise, for example. In particular, the useful signal can have a relatively narrowband frequency spectrum in this case, whereas the noise is formed by superimposition of a multiplicity of sound sources, having different frequency spectra. This is the case particularly when listening to voice, the sound of which has a few harmonic components of small bandwidth whose individual frequencies are each characteristic of the spoken vowels or consonants.

The technical challenge in a hearing device, then, is to lower the level of the noise in the input signal as far as possible and thereby to suppress the noise, whereas the level of the useful signal is intended not to be affected by this lowering as far as possible, that is to say that the signal-to-noise ratio is intended to be improved, the hearing device itself having only limited installation space available for the apparatuses for the required signal processing.

To this end, a frequency-band-dependent gain is often applied to the input signal. In this case, the input signal is first of all broken down into a plurality of frequency bands having a respective determined bandwidth and center frequency by a filter bank. For each individual frequency band, the existent level of the signal component in the frequency band is thus used to lower or raise the respective gain in the frequency band. Since the useful signal usually results in a higher level amplitude, the signal level in frequency bands in which there is no useful signal but rather only noise is lowered in relation to the useful signal, whereas the signal level in frequency bands having a high spectral component of the useful signal is maintained. Overall, this improves the signal-to-noise ratio.

In most cases, a gain factor is applied to the entire frequency band each time in this scenario, i.e. all the signal components in the relevant frequency band are amplified using the same factor at a given time. In a frequency band having a narrowband component of the useful signal, however, the high level results, for all frequencies of the signal in the relevant frequency band, in a high gain in comparison with frequency bands without a useful signal component, whose signal is lowered further. However, this also concomitantly amplifies ("comodulates") the noise component in the relevant frequency band. The natural rhythm of speech means that the harmonic components of the voice sound occur in rapid alternation in different frequency bands, so that this alternation influences the entire gain of the frequency bands each time, which comodulates noise in each of the different frequency bands. This results in audible wideband sound artifacts, which are undesirable.

US 2006/256764 A1 proposes a method for frequency-dependent noise suppression in an input signal, wherein a frequency-dependent signal is generated from a time-dependent input signal, and wherein the power spectrum of the frequency-dependent signal is used to infer a selected, particularly noise-containing, frequency component. An adjusted power spectrum produced on the basis of the selected frequency component is combined with the frequency-dependent signal, and a time-dependent output signal is generated therefrom.

In addition, U.S. Pat. No. 6,523,003 B1 discloses a method for spectral noise suppression, wherein an input signal is split spectrally in a main signal path by a filter. Parameters for controlling the frequency response of the input signal are assessed in multiple ancillary signal paths. In addition, U.S. Pat. No. 6,523,003 B1 describes a method for spectral noise suppression, wherein an input signal is distributed to a main signal path and to an ancillary signal path. In the main signal path, the input signal is broken down into frequency components. In the ancillary signal path, voice activity is inferred and, in periods without voice activity, the input signal broken down according to frequency is used to infer a frequency-dependent signal-to-noise ratio (SNR). The signal in the main signal path is attenuated in a frequency-dependent manner on the basis of the ascertained SNR.

BRIEF SUMMARY OF THE INVENTION

The invention is based on the object of specifying a method for frequency-dependent noise suppression in an input signal, in which narrowband useful signal components are intended to bring about as little comodulation of wideband noise as possible.

The invention achieves the cited object by means of a method for frequency-dependent noise suppression in an input signal, wherein the input signal is distributed to a main signal path and an ancillary signal path, wherein the presence of a useful signal component and, if a useful signal component is present, a parameter for a frequency of the useful signal component are assessed in the ancillary signal path, and wherein noise in the input signal is suppressed in the main signal path by at least one infinite impulse response filter whose frequency response is implemented with a maximum absolute value in the region of that frequency of the useful signal component that is assessed using the parameter by determining a complex pole of the transfer function, the complex pole of the transfer function being determined by using the assessed parameter for the frequency of the useful signal component. Advantageous refinements that are in some cases inventive in themselves are the subject matter of the subclaims and of the description below.

In particular, the input signal is a digital signal. The frequency of the useful signal component that is assessed using the parameter may particularly be a center frequency or a maximum frequency. In this case, the frequency of the useful signal component is determinable, in particular univocally, from the parameter, i.e. any uncertainty in the determination of the frequency results solely from the uncertainty in the assessment of the parameter. In the present case, the maximum absolute value of the frequency response is intended to be understood to mean a genuine maximum, that is to say that the absolute value of the frequency response assumes the maximum within the scope of the frequency resolution of the filter only for one frequency.

The spectral width of the filter can be obtained from a further assessment on the basis of the assessed useful signal component, or may be prescribed as a fixed value. In this context, the spectral width is intended to be understood as that distance from the maximum frequency of the filter (that is to say the frequency of the maximum absolute value of the frequency response) in the frequency domain for which the absolute value of the frequency response of the filter has decreased to a particular value, for example by 10 dB or 20 dB, relative to the maximum absolute value.

The frequency response of the filter can preferably be chosen such that for signal components having frequencies outside a window of the spectral width around the maximum frequency, there is significant attenuation of the signal level (for example by 10 dB or 20 dB). The effect that could be achieved by a suitable filter having such a frequency response is that, in the region of the assessed frequency of the useful signal component, the input signal remains largely uninfluenced by the filter, but noise components away from an isolated useful signal component can be efficiently suppressed in the main signal path on the basis of the parameters assessed in the ancillary signal path.

Similarly efficient suppression of undesirable wideband noise while simultaneously maintaining the level of a narrowband useful signal component could also be achieved by sufficiently high-resolution frequency band filtering of the input signal in order to pinpoint the useful signal components as accurately as possible in the frequency domain accordingly. In the ancillary signal path, this would involve analysis of the respective levels of the signal components of the input signal broken down into a multiplicity of frequency bands, and the ascertainment of respective gain factors therefrom for the individual frequency band channels, which gain factors would need to be applied to the individual signal components of the input signal in the main signal path. With such an approach, the quality of the noise suppression, and particularly of the comodulated noise components in an output signal, is definitively dependent on the frequency resolution, that is to say the bandwidth of the individual frequency bands, however.

Since a high frequency resolution is accompanied by high latency, however, and hence the individual gain factors for the respective frequency band channels in the ancillary signal path are obtained with a certain time delay, which is higher the higher the frequency resolution, the proposed method has, by contrast, advantages in the temporal resolution specifically in the case of rapidly varying useful signal components, as arise in the sound of spoken language.

In particular, the spectral width of the filter can be adjusted using an appropriate width parameter in this case on the basis of an assumed reliability of the assessment of the parameter for the frequency of the useful signal component. Assuming that a useful signal component can, in most relevant cases, be associated with a harmonic frequency component of spoken language, and has a correspondingly small bandwidth, the frequency response of the filter can accordingly be provided with a small spectral width if the assessment of the parameter and hence indirectly the frequency of the useful signal component can be assumed to be reliable. If the parameter for the frequency and hence indirectly also the frequency of the useful signal component itself cannot be assessed with sufficient reliability, however, then a frequency response having a correspondingly larger spectral width preferably needs to be chosen in order to ensure that the useful signal component is not affected by the attenuation of another filter.

Preferably, when a presence of a useful signal component is ascertained by assessment, a width parameter for the useful signal component is assessed. In particular, the width parameter can be obtained from a variance in the assessment of the frequency of the useful signal component. In particular, the width parameter is dependent on a real and/or assumed reliability of the assessment of the parameter for the frequency of the useful signal component.

Such a width parameter can be used for stipulating the spectral width of the frequency response of the filter. As a result, the frequency response of the filter can be chosen to have a more narrowband nature the more certainly the indirect frequency assessment of the useful signal component takes place. If this assessment is rated as less reliable, then the frequency range around the frequency of the useful signal component, as assessed using the parameter, in which the filter does not yet significantly attenuate signal components is increased by a correspondingly higher spectral width, in order to exclude the useful signal component from attenuation by the filter with as much certainty as possible.

Expediently, the filter in the main signal path forwards the one signal in essentially unaltered form at the frequency of the useful signal component. In this case, the frequency of the useful signal component is the frequency obtained in the ancillary signal path on the basis of the assessment of the corresponding parameter, unaltered forwarding meaning that, particularly at this frequency, no attenuation of the level takes place. In particular, the frequency of the useful signal component that is obtained by means of the assessment of the parameter is the maximum frequency of the filter in this case, so that the frequency response of the filter has a maximum gain of 0 dB. This allows a useful signal component to be able to be processed in subsequent signal processing processes without having to consider any influence of the noise suppression.

It is found to be advantageous if the presence of a useful signal component is assessed by an adaptive filter. While the pure presence of a useful signal component could a priori also be ascertained using the overall level of the input signal or of a signal component of the input signal in a particular frequency band, the use of an adaptive filter allows better reaction to fluctuations in the level of the useful signal component. An assessment of the presence of a useful signal component only using the signal level is a basis for the risk, when a limit value for the level is set too low, of signal components that do not really come from a useful signal also indicating an alleged presence of a useful signal component. When a limit value for the level is set too high, a useful signal component that has a lower amplitude may not be recognized as such.

The use of an adaptive filter for assessing the presence of a useful signal component allows the natural fluctuations in the volume of the useful signal components for spoken language to be better able to be taken into account. In particular, noise can be suppressed by lowering levels over a wide band when no useful signal component is assessed as present in the relevant frequency range at a particular time.

In the main signal path, noise in the input signal is suppressed by at least one infinite impulse response filter (IIR filter). An IIR filter allows particularly simple implementation of a frequency response that is desired for the filter, in particular it is possible to implement a filter having a desired bandpass property using an IIR filter with comparatively low computation power. As a result, the delay in the input signal as a result of the filter can be kept within a practically negligible range in the main signal path.

In this case, a complex pole of the transfer function of the IIR filter is determined by using the parameter for the frequency of the useful signal component. The frequency response of an IIR filter is usually definitively determined by the pole(s) of the transfer function. If a complex pole of the transfer function of the filter is determined by using the assessed parameter for the frequency of the useful signal component, then this allows a piece of information that is implicitly contained in the parameter about the frequency of the useful signal component to be included in the frequency response of the IIR filter.

Preferably, the complex pole of the transfer function is ascertained in this case on the basis of the complex correlation function x(k)x*(k−1) of a signal component x(k) for a discrete time index k, wherein the direction of an indicator of the complex pole is ascertained by the unit vector:

$$\frac{x(k)x^*(k-1)}{|x(k)x^*(k-1)|}$$

of the correlation function. The input signal is usually available in digital form, which means that the discrete time index k be based on numbering of the individual samples or, if a plurality of samples are combined into individual frames each time, mean indexing of the respective frame. In particular, the signal component x(k) can in this case mean the signal component of the input signal in a particular frequency band when the input signal is split into individual frequency bands for the noise suppression method. Such filtering can involve individual signal components x(k) becoming complex valued, which needs to be taken into account for further signal processing. The use of the correlation function of the signal component x(k) at two successive times for the direction of an indicator of the complex pole and indirectly for assessing the frequency of the useful signal component is in this case based on the consideration that, on the one hand, wideband noise has largely uncorrelated timing, while on the other hand, a useful signal component remains largely steady for two successive time indices and hence can be detected by the correlation function. In particular, this can also involve the use of a correlation function that includes the signal component x(k) at more than two successive times. Restriction to two successive times k−1, k is advantageous for reasons of computational efficiency, however.

Expediently, the width parameter of the useful signal component is assessed in this case using an assessment of the variance in the correlation function, wherein this is used to ascertain a radius of the complex pole of the transfer function. If the correlation function has a smaller degree of variance, this means that the signal components ascertained as correlated are particularly narrowband. Conversely, a larger variance for the correlation function allows inference of a broader spectrum of the significant signal components of the signal ascertained as having self-correlated timing. This can be used to determine the width parameter of the useful signal component. In the case of an IIR filter, a statement is made about the spectral width of the frequency response using the radius of a complex pole.

Preferably, noise in the input signal is suppressed in the main signal path by at least one first-order IIR filter. A first-order IIR filter is firstly particularly simple and efficient to implement in terms of signal processing. Secondly, it has a particularly simple correlation between the frequency response or the spectral width and the complex pole of the transfer function.

In a further advantageous refinement of the invention, the input signal is broken down into a plurality of frequency bands having a respective particular bandwidth by means of a filter bank, wherein the presence of a useful signal component and, if a useful signal component is present, a parameter for the frequency of the useful signal component are assessed in each frequency band in the ancillary signal path. In particular, noise in the input signal is suppressed in the main signal path in each frequency band in which the presence of a useful signal component is assessed, using a filter whose frequency response has a maximum absolute value in the region of that frequency of the useful signal component that is assessed using the parameter. In this case, the breakdown of the input signal into a plurality of frequency bands provides a prior selection, since the usual distribution of the useful signal components in the sound of spoken language means that individual frequency bands each remain temporarily free of useful signal components. Accordingly, noise can be suppressed in these frequency bands by simply lowering the level by a factor that is constant for the entire frequency band, since no useful signal components need to be taken into account. In addition, this allows individual useful signal components in different frequency bands each to be taken into account separately from one another. Both simplify the computation complexity for the method, the rise in the computation complexity as a result of the preliminary filtering in the individual frequency bands remaining negligible in contrast.

It is found to be additionally advantageous in this context if for each frequency band in the ancillary signal path, a respective bypass filter reduces an overlap with an adjacent frequency band before a presence of a useful signal component is assessed. The smaller the overlap between two adjacent frequency bands, the more univocally a useful signal component can be associated with an individual frequency band, so that a computation power for computing the filter parameters beneficially arises only for one frequency band.

Preferably, in the ancillary signal path, in one frequency band, a plurality of bandpass filters having essentially non-overlapping frequency responses split the signal component x(k) of the input signal into frequency subbands, wherein the presence of a useful signal component and, if a useful signal component is present, a parameter for a frequency of the useful signal component are assessed in each frequency subband, and wherein noise in the input signal is suppressed in the relevant frequency band in the main signal path using an IIR filter whose order corresponds to the number of frequency subbands for which a presence of a useful signal component has been assessed. This measure allows the spectral resolution of the noise suppression to be increased further, as a result of which the proportion of comodulated noise changes. Since the measures for determining the useful signal components are performed in the ancillary signal path, this results in no further increase in latency in the main signal path. In particular, the IIR filter can in this case be formed from a successive application of multiple first-order IIR filters whose complex poles can each be associated with an assessed useful signal component. In this case, the overall frequency response of the IIR filter needs to be coordinated such that no attenuation takes place at each frequency of an assessed useful signal component.

The invention additionally cites a hearing device, particularly a hearing aid, comprising at least one microphone for recording an input signal and a signal processing unit that is set up to perform the method as claimed in one of the preceding claims. The advantages cited for the method and for developments thereof can be transferred mutatis mutandis to the hearing device in this case.

BRIEF DESCRIPTION OF THE SEVERAL VIEWS OF THE DRAWING

An exemplary embodiment of the invention is explained in more detail below with reference to a drawing, in which, in each case schematically:

FIG. 3 shows a graph containing a signal component as shown in FIG. 2 in which the noise has been suppressed on a frequency-dependent basis by means of, FIG. 4 shows a hearing aid

DESCRIPTION OF THE INVENTION

Parts and variables that correspond to one another are each provided with the same reference symbols in all the figures.

Figure 1:
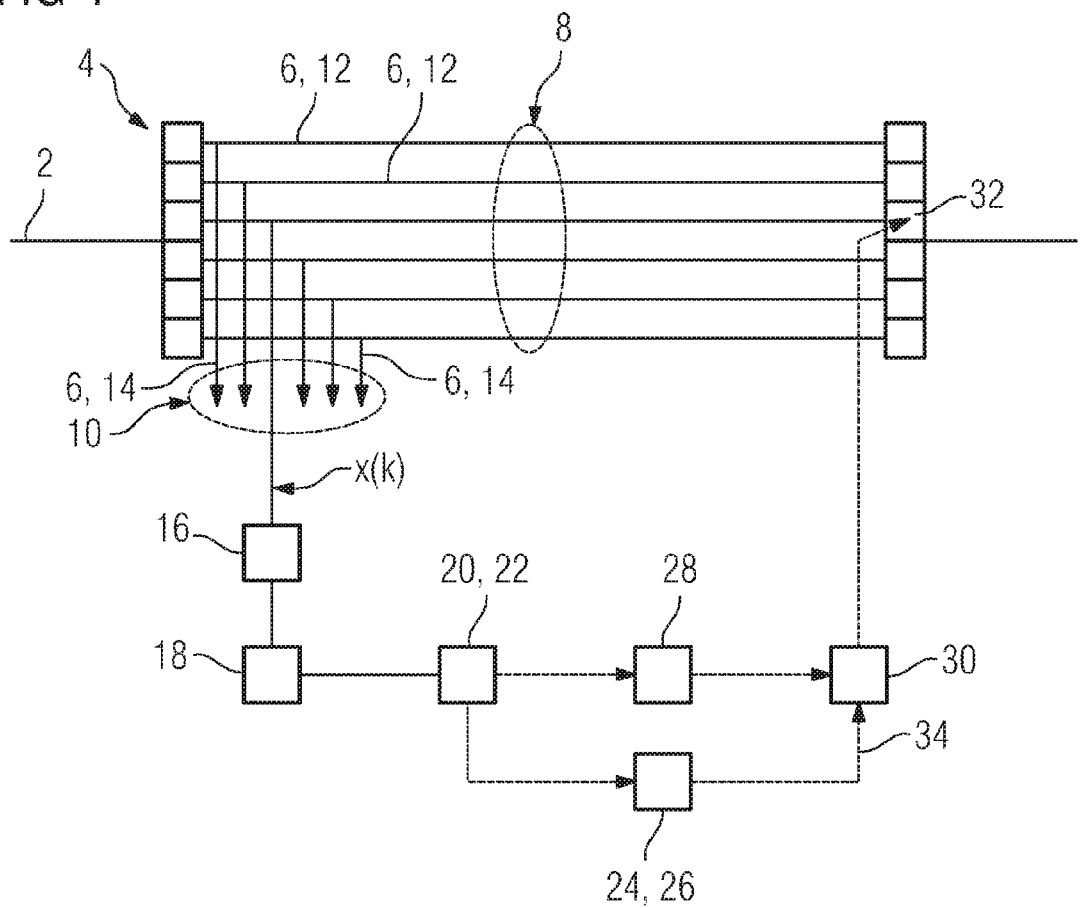
FIG. 1 shows a block diagram of the sequence of a method for frequency-dependent noise suppression in an input signal.

FIG. 1 uses a block diagram to schematically show the sequence of a method 1 for frequency-dependent noise suppression in an input signal 2. A filter bank 4 first of all splits the input signal 2 into a plurality of frequency bands 6. The input signal 2 broken down into the individual frequency bands 5 is furthermore split over a main signal path 8 and an ancillary signal path 10, the main signal path 8 and the ancillary signal path 10 each being formed by individual frequency band channels 12, 14 corresponding to the frequency bands 6. In the ancillary signal path 10, a bandpass filter 16 is first of all applied in each frequency band channel 14, said bandpass filter reducing the overlap between the frequency band 6 corresponding to the frequency band channel 14 and relevant adjacent frequency bands.

The signal filtered by the bandpass filter 16 is thus examined for the presence of a useful signal component by using an adaptive filter 18. In this case, particularly when the presence of a useful signal component is identified at a particular time, the adaptive filter 18 can take the alterations in the signal level for the identified useful signal component as a basis for inferring a further presence of the useful signal component at a later time. If the presence of a useful signal component is assumed, then a temporal correlation function 20, which is used as a parameter 22 for a frequency of the useful signal component, is computed from a signal component x(k) in the respective frequency band channel 14 for a discrete time index k. In addition, the variance 24 in the correlation function is ascertained, which is used as a width parameter 26 for the useful signal component. In this case, the unit vector of the correlation function 20 is used as a direction for an indicator 28 that forms the complex pole 30 of a transfer function of an IIR filter 32. The radius 34 of the complex pole 30 is formed by the width parameter 26. In the main signal path 8, the input signal 2 in the frequency band channel 12 thus prompts filtering of the IIR filter 32 with the filter parameters obtained from the parameter 22 for the frequency of the useful signal component and the width parameter 26. In this case, any useful signal component in the relevant frequency band 6 is maintained, while wideband noise is attenuated by the IIR filter 32 away from the useful signal component. If the adaptive filter 18 does not identify the presence of a useful signal component during the assessment, however, then the IIR filter 32 remains inactive, the filter parameter implemented in this case in the respective frequency band 6 being attenuation of the level using a factor that is constant over the entire frequency band 6 for noise suppression.

Figure 2:
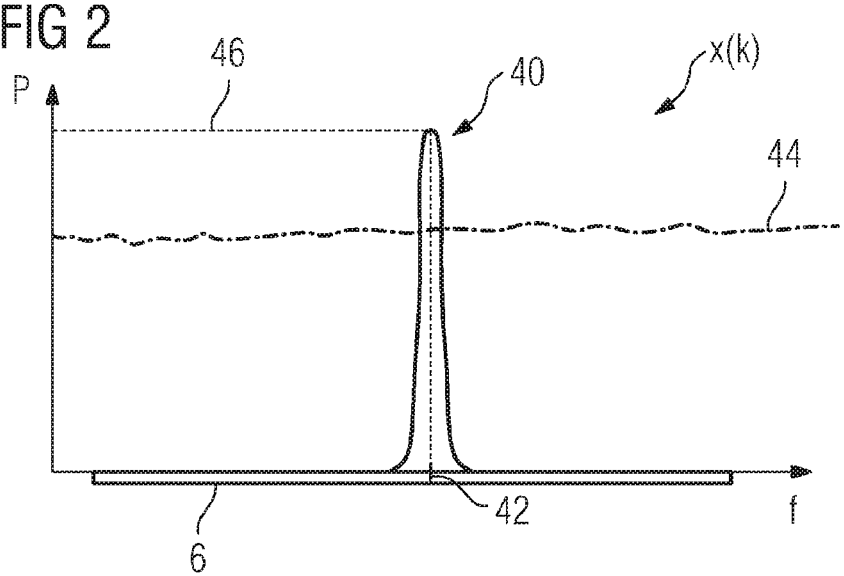
FIG. 2 shows a graph containing a signal component of an input signal with a useful signal component and wideband noise.

FIG. 2 shows a graph containing the signal power P of a signal component x(k) in a frequency band 6 plotted against the frequency f thereof. The signal component x(k) has a narrowband useful signal component 40 that has concentrated all the spectral components essentially around a frequency 42 at which the useful signal component 40 assumes its maximum signal power. The useful signal component 40 is superimposed with wideband noise 44, the signal power of which is essentially constant over the entire frequency range of the frequency band 6 apart from the natural, intrinsic, fluctuations in the noise 44 and is significantly below the maximum signal power 46 of the useful signal component 40 at the frequency 42. In this case, the signal power of the noise 44 can nevertheless be assumed to be high enough to be perceived as a disturbance by a listener. It is therefore desirable for the noise 44 to be suppressed, this being intended to impair the useful signal component 40 as little as possible. Such suppression is shown schematically in FIG. 3. The signal component x(k) in the frequency band 6, which signal component comprises the useful signal 40 and the noise 44 superimposed thereon, thus has a first-order IIR filter applied to it whose frequency response 50 has a maximum absolute value 52 at the frequency 42 of the useful signal component 40. In this case, the frequency response 50 can be set such that the useful signal component 40 passes through the filter without its level being altered, so that no level alterations in the useful signal components need to be taken into account in subsequent signal processing steps by the method for frequency-dependent noise suppression. This means that the frequency response 50 assumes its maximum absolute value 52 at a value of 0 dB.

However, the frequency 42 of the useful signal component 40 undergoes considerable level attenuation as a result of the filter, as can be identified from the signal path 54—shown in dashes—of the noise 44 suppressed by the filter. As the distance from the frequency 42 of the useful signal component 40 increases, the difference between the maximum power 46 of the useful signal component 40 and the power of the noise 54, and hence the signal-to-noise ratio, increases considerably.

In this case, the frequency 42 for the maximum absolute value 52 of the frequency response 50 of the first-order IIR filter and the spectral width 56 of the frequency response 50 are directly dependent on the complex pole $z_0$ of the transfer function G(z) of the IIR filter. Said transfer function is provided by:

$$G(z) = \frac{b}{1 - z^{-1} \cdot z_0}.$$

In this case, the direction for the indicator of the complex pole $z_0$ is provided by the unit vector:

$$\frac{x(k)x^*(k-1)}{|x(k)x^*(k-1)|}$$

of the correlation function $x(k)x^*(k-1)$. The radius for the complex pole $z_0$ is provided by the variance in the correlation function. The parameter b for the transfer function $G(z)$ can be chosen such that the frequency response 50 of the IIR filter assumes its maximum absolute value 52 at a value of 0 dB.

FIG. 4 schematically shows a hearing device 60 that is in the form of a hearing aid 62. In this case, the hearing device 60 comprises a microphone 64 that converts a sound from the surroundings into an input signal 2. In addition, the hearing device 60 comprises a signal processing unit 66 to which the input signal 2 is supplied and that suppresses noise in the input signal 2 on a frequency-dependent basis in a prescribed manner, and if need be performs further signal processing processes that are typical of a hearing device. A final signal 68 that is processed to completion by the signal processing unit 66 is forwarded to a loudspeaker 70 of the hearing device 60, and is converted into a sound signal by the latter.

Although the invention has been illustrated and described in more detail using the preferred exemplary embodiment, the invention is not restricted by this exemplary embodiment. Other variations can be derived therefrom by a person skilled in the art without departing from the scope of protection of the invention.

LIST OF REFERENCE SYMBOLS

1 Method
2 Input signal
4 Filter bank
6 Frequency band
8 Main signal path
10 Ancillary signal path
12 Frequency band channel
14 Frequency band channel
16 Bandpass filter
18 Adaptive filter
20 Correlation function
22 Parameter for frequency
24 Variance in the correlation function
26 Width parameter
28 Indicator
30 Complex pole
32 IIR filter
34 Radius of the complex pole
40 Useful signal component
42 Frequency of the useful signal component
44 Noise
46 Maximum power
50 Frequency response
52 Maximum absolute value
54 Suppressed noise
56 Spectral width
60 Hearing device
62 Hearing aid
64 Microphone
66 Signal processing unit
68 Final signal
70 Loudspeaker
f Frequency
P Power, signal power
x(k) Signal component

The invention claimed is:

1. A method for frequency-dependent noise suppression in an input signal, the method comprising:
   distributing the input signal to a main signal path and an ancillary signal path;
   determining whether a useful signal component is present in the ancillary signal path and, if a useful signal component is present, assessing a parameter for a frequency of the useful signal component in the ancillary signal path; and
   suppressing noise in the input signal in the main signal path by at least one infinite impulse response filter whose frequency response is implemented with a maximum absolute value in a range of the frequency of the useful signal component that is assessed using the parameter, and determining a complex pole of the transfer function in order to have the maximum absolute value in the range of the frequency of the useful signal component that is assessed using the parameter, wherein the complex pole of the transfer function is determined by using the assessed parameter for the frequency of the useful signal component.

2. The method according to claim 1, which comprises, after ascertaining a presence of the useful signal component, assessing a width parameter for the useful signal component.

3. The method according to claim 1, wherein the filter passes the input signal in the main signal path in substantially unaltered form at the frequency of the useful signal component.

4. The method according to claim 1, wherein the determining step comprises assessing the presence of the useful signal component by an adaptive filter.

5. The method according to claim 1, which comprises assessing the parameter for the frequency of the useful signal component on a basis of a complex correlation function $x(k)x^*(k-1)$ of a signal component $x(k)$ for a discrete time index k, and ascertaining a direction of a vector of the complex pole by a unit vector of the correlation function.

6. The method according to claim 5, which comprises, after ascertaining a presence of the useful signal component, assessing a width parameter for the useful signal component by using an assessment of a variance in the correlation function, and using the variance to ascertain a radius of the complex pole of the transfer function.

7. The method according to claim 1, which comprises suppressing noise in the input signal in the main signal path by at least one first-order infinite impulse response filter.

8. The method according to claim 1, which comprises:
   breaking down the input signal into a plurality of frequency bands having a respective particular bandwidth by way of a filter bank;
   determining the presence of a useful signal component and, if a useful signal component is present, assessing a parameter for the frequency of the useful signal component in each frequency band in the ancillary signal path.

9. The method according to claim 8, which comprises, for each frequency band in the ancillary signal path, reducing with a respective bandpass filter an overlap with an adjacent frequency band before assessing a presence of a useful signal component.

10. The method according to claim 7, which comprises, in the ancillary signal path, in one frequency band:
    splitting the signal component x(k) of the input signal into frequency subbands with a plurality of bandpass filters having substantially nonoverlapping frequency responses; and assessing the presence of a useful signal component and, if a useful signal component is present, a parameter for a frequency of the useful signal component in each frequency subband; and suppressing noise in the input signal in a relevant frequency band in the main signal path using an infinite impulse response filter whose order corresponds to a number of the frequency subbands for which a presence of a useful signal component has been assessed.

11. A hearing device, comprising:

at least one microphone for recording an input signal; and a signal processing unit connected to receive the input signal from said at least one microphone and configured:

to distribute the input signal to a main signal path and an ancillary signal path;

to determine whether a useful signal component is present in the ancillary signal path and, if a useful signal component is present, assessing a parameter for a frequency of the useful signal component in the ancillary signal path; and to suppress noise in the input signal in the main signal path by at least one infinite impulse response filter whose frequency response is implemented with a maximum absolute value in a range of the frequency of the useful signal component that is assessed using the parameter, and determining a complex pole of the transfer function in order to have the maximum absolute value in the range of the frequency of the useful signal component that is assessed using the parameter, wherein the complex pole of the transfer function is determined by using the assessed parameter for the frequency of the useful signal component.

12. The hearing device according to claim 11, configured as a hearing aid.

* * * * *